(12) United States Patent
Dewey et al.

(10) Patent No.: US 11,508,577 B2
(45) Date of Patent: Nov. 22, 2022

(54) CHANNEL LAYER FORMATION FOR III-V METAL-OXIDE-SEMICONDUCTOR FIELD EFFECT TRANSISTORS (MOSFETS)

(71) Applicant: Intel Corporation, Santa Clara, CA (US)

(72) Inventors: Gilbert Dewey, Beaverton, OR (US); Matthew Metz, Portland, OR (US); Willy Rachmady, Beaverton, OR (US); Sean Ma, Portland, OR (US); Nicholas Minutillo, Beaverton, OR (US); Cheng-Ying Huang, Hillsboro, OR (US); Tahir Ghani, Portland, OR (US); Jack Kavalieros, Portland, OR (US); Anand Murthy, Portland, OR (US); Harold Kennel, Portland, OR (US)

(73) Assignee: Intel Corporation, Santa Clara, CA (US)

(*) Notice: Subject to any disclaimer, the term of this patent is extended or adjusted under 35 U.S.C. 154(b) by 983 days.

(21) Appl. No.: 16/024,694

(22) Filed: Jun. 29, 2018

(65) Prior Publication Data
US 2020/0006069 A1    Jan. 2, 2020

(51) Int. Cl.
| | |
|---|---|
| *H01L 21/02* | (2006.01) |
| *H01L 29/20* | (2006.01) |
| *H01L 29/04* | (2006.01) |
| *H01L 29/78* | (2006.01) |
| *H01L 27/12* | (2006.01) |

(52) U.S. Cl.
CPC .... *H01L 21/02645* (2013.01); *H01L 21/0242* (2013.01); *H01L 21/02538* (2013.01); *H01L 27/1203* (2013.01); *H01L 29/045* (2013.01); *H01L 29/20* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 9,349,789 | B1* | 5/2016 | Vega | H01L 28/91 |
| 2009/0278125 | A1* | 11/2009 | Duan | B82Y 10/00 |
| | | | | 257/49 |
| 2015/0243690 | A1* | 8/2015 | Jin | H01L 21/02568 |
| | | | | 438/158 |

OTHER PUBLICATIONS https://www.tsmc.com/english/dedicatedFoundry/technology/logic/l_16_12nm (Year: 2021).*

* cited by examiner

*Primary Examiner* — Vincent Wall
(74) *Attorney, Agent, or Firm* — Schwabe, Williamson & Wyatt, P.C.

(57) ABSTRACT

Embodiments herein describe techniques, systems, and method for a semiconductor device. Embodiments herein may present a semiconductor device including a substrate and an insulator layer above the substrate. A channel area may include an III-V material relaxed grown on the insulator layer. A source area may be above the insulator layer, in contact with the insulator layer, and adjacent to a first end of the channel area. A drain area may be above the insulator layer, in contact with the insulator layer, and adjacent to a second end of the channel area that is opposite to the first end of the channel area. The source area or the drain area may include one or more seed components including a seed material with free surface. Other embodiments may be described and/or claimed.

17 Claims, 7 Drawing Sheets

CHANNEL LAYER FORMATION FOR III-V METAL-OXIDE-SEMICONDUCTOR FIELD EFFECT TRANSISTORS (MOSFETS)

FIELD

Embodiments of the present disclosure generally relate to the field of integrated circuits, and more particularly, to III-V metal-oxide-semiconductor field effect transistors (MOSFETs).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditional integrated circuits, e.g., metal-oxide-semiconductor field effect transistors (MOSFETs), may be based on silicon. On the other hand, compounds of group III-V elements may have superior semiconductor properties than silicon, including higher electron mobility and saturation velocity, leading to better performance for III-V MOSFETs, or simply III-V transistors. However, the fabrication process for III-V MOSFETs may be complicated and expensive with high defect product rates.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
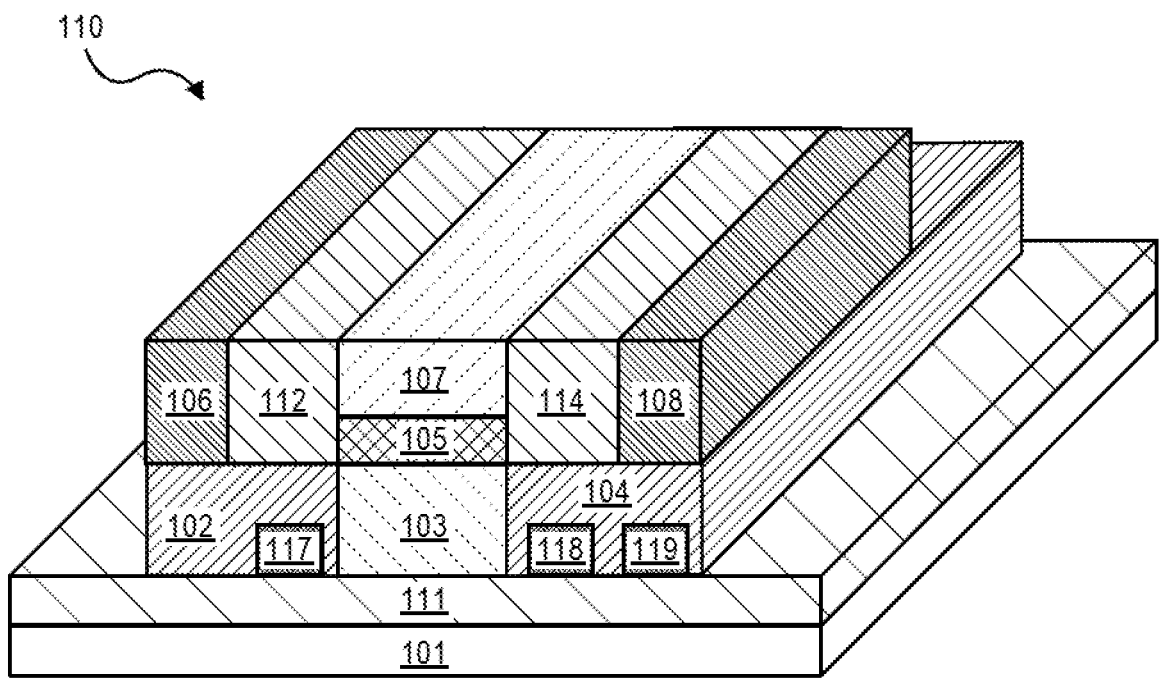
FIGS. 1(a)-1(b) schematically illustrate example III-V metal-oxide-semiconductor field effect transistors (MOSFET) including a source area or a drain area with one or more seed components, in accordance with some embodiments.

Compounds of group III-V elements such as gallium arsenide (GaAs), indium antimonide (InSb), indium phosphide (InP), and indium gallium arsenide (InGaAs) have superior semiconductor properties than silicon, including higher electron mobility and saturation velocity. As a result, III-V metal-oxide-semiconductor field effect transistors (MOSFETs) may have better performance than silicon transistors as well. An III-V MOSFET, or simply referred to as an III-V transistor, may include a source area and a drain area adjacent to a channel area. For the description below, a source area and a drain area may be used interchangeably.

An III-V transistor may be formed on a silicon substrate or some other substrate. Fabricating defect free non-lattice matched channel areas on a substrate may be difficult. Buffer layers or aspect ratio trapping trenches have been used to fabricate the channel area on a substrate. However, a buffer layer to trap the defects to prevent them from growing into a channel area may be thick and expensive to make. On the other hand, an aspect ratio trapping trench may be effective in a narrower width direction, but ineffective in the longer length direction along the trench.

Embodiments herein may pattern one or more seed components including a seed material with free surface on an insulator layer above the substrate. The seed components may have smaller sizes compared to a channel area. The seed components may become strained to the lattice of the channel material. Hence, the defects may be more likely formed in the seed components rather than the channel area. Accordingly, the channel area includes an III-V material relaxed grown on the insulator layer, without being thick to avoid the defects. Afterwards, the defects formed in the seed components may be removed. In addition, the geometry and free surface area of the seed components may be engineered to produce a non-lattice matched material on the substrate with reduced amount of defects.

Embodiments herein may present a semiconductor device. The semiconductor device may include a substrate and an insulator layer above the substrate. A channel area may include an III-V material relaxed grown on the insulator layer. A source area may be above the insulator layer, in contact with the insulator layer, and adjacent to a first end of the channel area. A drain area may be above the insulator layer, in contact with the insulator layer, and adjacent to a second end of the channel area that is opposite to the first end of the channel area. The source area or the drain area may include one or more seed components including a seed material with free surface.

Embodiments herein may present a method for forming a semiconductor device. The method may include forming an insulator layer above a substrate, and forming one or more seed components including a seed material with free surface above the insulator layer. The method may further include relaxed growing from the one or more seed components a channel layer above the one or more seed components, above the insulator layer, and in contact with the insulator layer. The channel layer includes an III-V material. Furthermore, the method includes patterning the channel layer into a channel area.

Embodiments herein may present a computing device. The computing device may include a processor; and a memory device coupled to the processor, where the memory device or the processor includes a transistor. The transistor may include a substrate and an insulator layer above the substrate. A channel area may include an III-V material relaxed grown on the insulator layer. A source area may be above the insulator layer, in contact with the insulator layer, and adjacent to a first end of the channel area. A drain area may be above the insulator layer, in contact with the insulator layer, and adjacent to a second end of the channel area that is opposite to the first end of the channel area. The source area or the drain area may include one or more seed components including a seed material with free surface.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
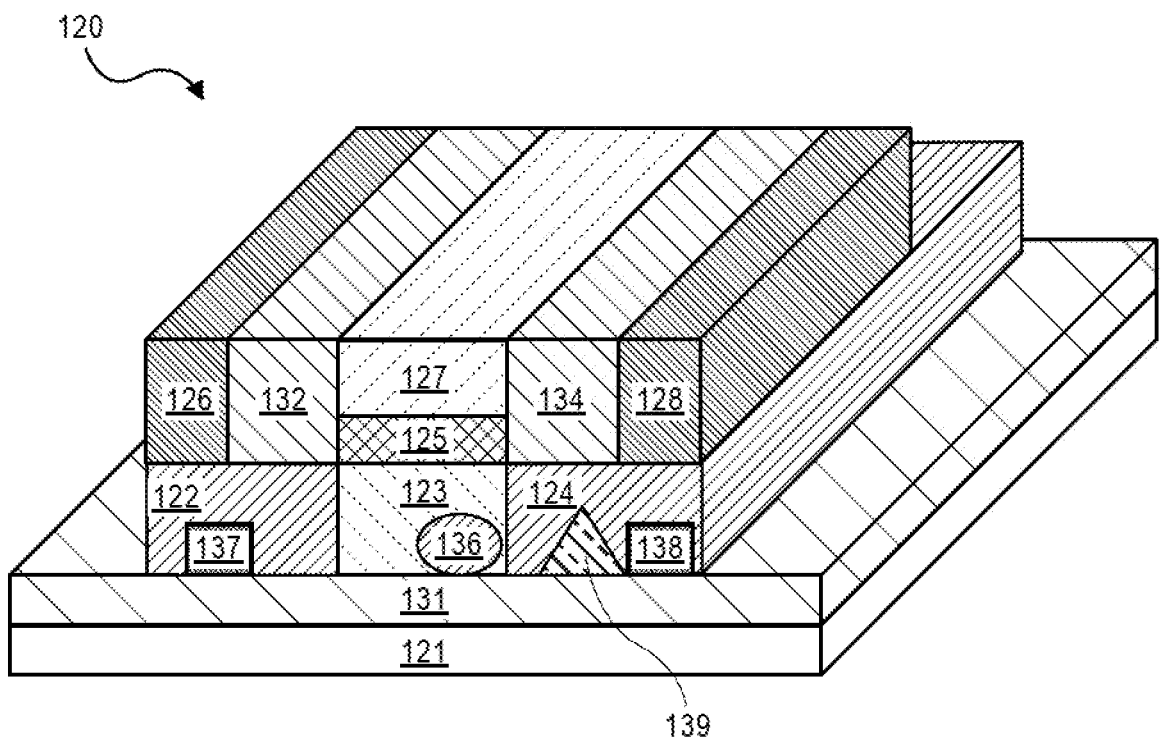

FIGS. 1(a)-1(b) schematically illustrate example III-V MOSFETs, e.g., an III-V transistor 110, or an III-V transistor 120, including a source area or a drain area with one or more seed components, in accordance with some embodiments. For clarity, features of the III-V MOSFET 110 or the III-V transistor 120 may be described below as examples for understanding an III-V transistor including a source area or a drain area with one or more seed components. Further, it is to be understood that one or more of the components of an III-V transistor including a source area or a drain area with one or more seed components, may include additional and/or varying features from the description below, and may include any device that one having ordinary skill in the art would consider and/or refer to as an III-V transistor including a source area or a drain area with one or more seed components.

In embodiments, the III-V transistor 110 includes a substrate 101, an insulator layer 111 above the substrate 101, and a channel area 103 on the insulator layer 111. The channel area 103 may include an III-V material relaxed grown on the insulator layer 111. A source area 102 is above the insulator layer 111, in contact with the insulator layer 111, and adjacent to a first end of the channel area 103. A drain area 104 is above the insulator layer 111, in contact with the insulator layer 111, and adjacent to a second end of the channel area 103 that is opposite to the first end of the channel area. A gate dielectric layer 105 is above the channel area 103 and in contact with the channel area 103. A gate electrode 107 is above the gate dielectric layer 105. A source electrode 106 is in contact with the source area 102, and a drain electrode 108 is in contact with the drain area 104. A spacer 112 may be along a side wall of the gate electrode 107 to separate the gate electrode 107 and the source electrode 106, while a spacer 114 may be along a side wall of the gate electrode 107 to separate the gate electrode 107 and drain electrode 108.

In embodiments, the source area 102 may include a seed component 117 that includes a seed material with free surface. The drain area 104 may include a seed component 118 and a seed component 119 that include a seed material with free surface. As shown, the channel area 103 does not include a seed component. A seed component, e.g., the seed component 117, the seed component 118, or the seed component 119, in the source area 102 or the drain area 104 may be of a rectangular shape, a triangular shape, a circular shape, or a cone shape. A seed component, e.g., the seed component 117, the seed component 118, or the seed component 119, may have a small size, e.g., a size smaller and can be contained within a three dimensional space of (2-15) nm*(2-15) nm*(2-15) nm. A three dimensional space of (2-15) nm*(2-15) nm*(2-15) nm may refer to any three dimensional space has a length within a range of about 2 nm to about 15 nm, a width within a range of about 2 nm to about 15 nm, and a height within a range of about 2 nm to about 15 nm. A seed material included in a seed component, e.g., the seed component 117, the seed component 118, or the seed component 119, may include GaAs, Ge, $In_xGa_{1-x}As$, where x is between 0 and 1, InSb, InAs, GaP, InGaP, or InP. In addition, a seed material may be lattice matched to the III-V material of the channel area 103, or lattice matched to the substrate 101. Furthermore, a seed material includes a material with an etch selectivity different from the III-V material in the channel area 103. One or more seed components may be formed by various techniques, e.g., layer transfer. When one or more seed components are formed by layer transfer, a thin layer of Si, Ge, or various III-V blanket material may be transferred onto a substrate, e.g., a Si substrate, with an oxide layer between the active layer and the Si substrate. The thin transferred layer may be patterned into islands of a square, rectangular, triangular, or circular shape to form the one or more seed components.

In embodiments, the channel area 103 may be a FinFET channel, a nanowire channel, a vertical FET channel, a nanotube channel, or a nanoribbon channel. The channel area 103 includes an III-V compound, which may be a binary III-V compound, a ternary III-V compound, or a quaternary III-V compound. In detail, the III-V compound in the channel area 103 may include indium (In), phosphorus (P), gallium (Ga), or arsenic (As), SiGe, Al, GaAs, $In_xGa_{1-x}As$, $In_xGa_{1-x}P$, $GaAs_xSb_{1-x}$, where x is between 0 and 1, InSb, InAs, GaP, InGaP, and InP. The channel area 103 may be of a shape, such as a rectangular shape, a triangular shape, a square shape, or a polygon shape. The source area 102 or the drain area 104 may include a material similar to a material in the channel area 103, and may further include n-type dopant or p-type dopant. In addition, the insulator layer 111 may include a material selected from $SiO_2$, SiN, SiON, $Al_2O_3$, $AlSiO_x$, $HfSiO_x$, $HfO_2$, or $ZrO_2$.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, AlN, $SiO_2$, or Cu. The substrate 101 may include a high-resistivity p-type or n-type vicinal silicon material, germanium, germanium on silicon, gallium arsenide (GaAs), or a silicon-on-insulator substrate. For example, the substrate 101 may be a silicon substrate with a (111), (100), or (110) crystal plane as a principal plane.

In embodiments, gate dielectric layer 105 may include a high-k dielectric material. For example, gate dielectric layer 105 may include a material with a dielectric constant of at least about 10. In detail, gate dielectric layer 105 may include $Al_2O_3$, although other materials such as $La_2O_3$, $HfO_2$, $ZrO_2$, or ternary complexes such as $LaAl_xO_y$, $Hf_xZr_yO_z$ may be used in other embodiments.

In embodiments, the source electrode 106, the drain electrode 108, or the gate electrode 107 may be formed as a single layer or a stacked layer using one or more conductive films including a conductive material. For example, the source electrode 106, the drain electrode 108, or the gate electrode 107 may include a metallic material, a conductive polymer, a polysilicon, a titanium silicide, a phosphorus (n+) doped Si, a boron doped SiGe, or an alloy of a semiconductor material and a metal. For example the source electrode 106, the drain electrode 108, or the gate electrode 107 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al, Ni, Cu, Cr, TiAlN, HfAlN, or InAlO. The source electrode 106, the drain electrode 108, or the gate electrode 107 may include tantalum nitride (TaN), titanium nitride (TiN), iridium-tantalum alloy (Ir—Ta), indium-tin oxide (ITO), the like, and/or a combination thereof.

In embodiments, the III-V transistor 120 includes a substrate 121, an insulator layer 131 above the substrate 121, and a channel area 123 on the insulator layer 131. The channel area 123 may include an III-V material relaxed grown on the insulator layer 131. A source area 122 is above the insulator layer 131, in contact with the insulator layer 131, and adjacent to a first end of the channel area 123. A drain area 124 is above the insulator layer 131, in contact with the insulator layer 131, and adjacent to a second end of the channel area 123 that is opposite to the first end of the channel area. A gate dielectric layer 125 is above the channel area 123 and in contact with the channel area 123. A gate electrode 127 is above the gate dielectric layer 125. A source electrode 126 is in contact with the source area 122, and a drain electrode 128 is in contact with the drain area 124. A spacer 132 may be along a side wall of the gate electrode 127 to separate the gate electrode 127 and the source electrode 126, while a spacer 134 may be along a side wall of the gate electrode 127 to separate the gate electrode 127 and drain electrode 128.

In embodiments, the source area 122 may include a seed component 137 that includes a seed material with free surface. The drain area 124 may include a seed component 138 and a seed component 139 that include a seed material with free surface. Furthermore, the channel area 123 includes a seed component 136. A seed component, e.g., the seed component 136, the seed component 137, the seed component 138, or the seed component 139, in the channel area 123, the source area 122, or the drain area 124 may be of a rectangular shape, a triangular shape, a circular shape, or a cone shape. A seed component, e.g., the seed component 136, the seed component 137, the seed component 138, or the seed component 139, may have a small size, e.g., a size smaller and can be contained within a three dimensional space of 5-20 nm*5-20 nm*5-20 nm. A seed material included in a seed component, e.g., the seed component 136, the seed component 137, the seed component 138, or the seed component 139, may includes GaAs, Ge, $In_xGa_{1-x}As$, where x is between 0 and 1, InSb, InAs, GaP, InGaP, or InP. In addition, a seed material may be lattice matched to the III-V material of the channel area 123, or lattice matched to the substrate 121. Furthermore, a seed material includes a material with an etch selectivity different from the III-V material in the channel area 123.

Figure 2:
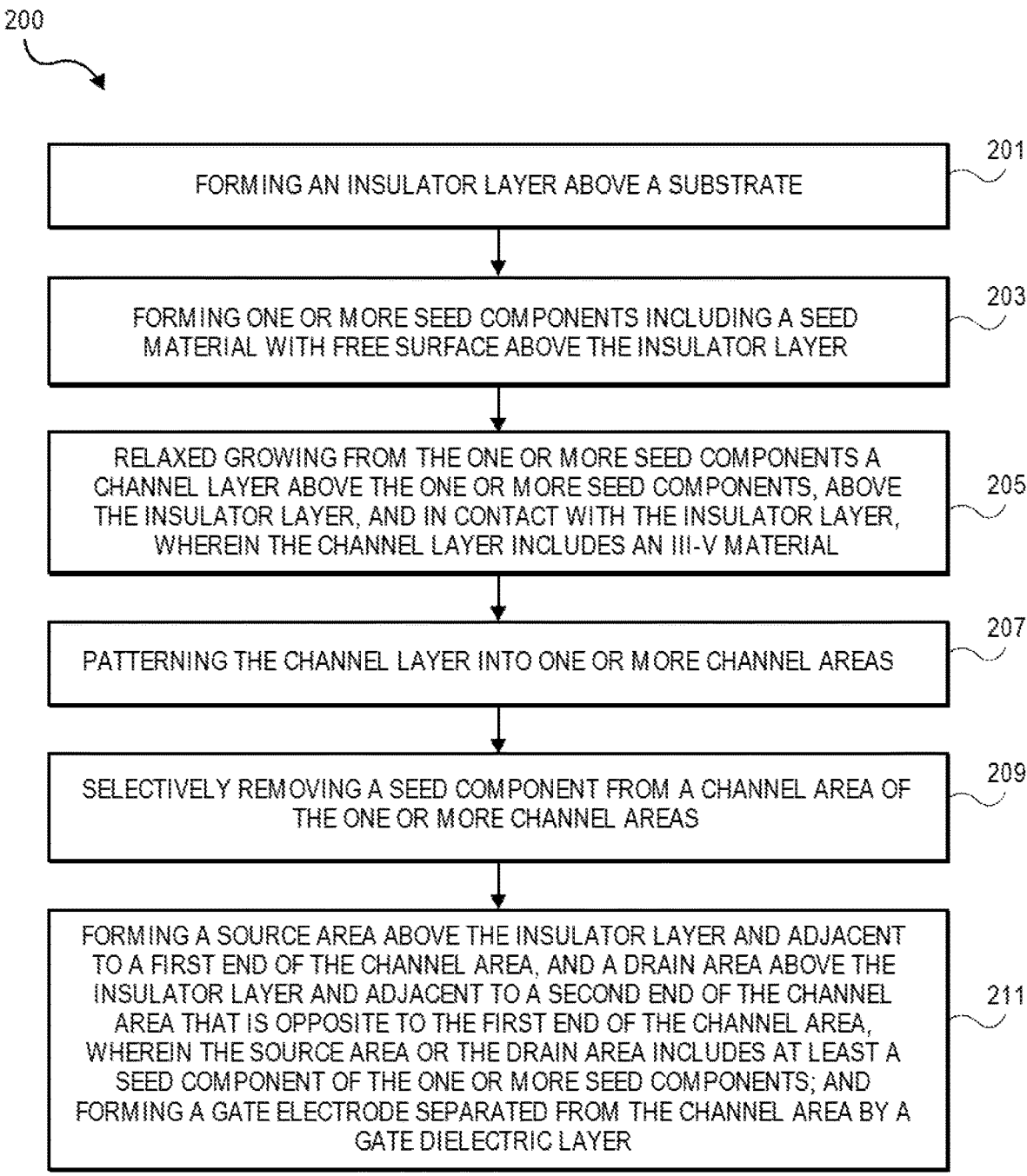
FIG. 2 schematically illustrates an example process for forming an III-V MOSFET including a source area or a drain area with one or more seed components, in accordance with some embodiments.

FIG. 2 schematically illustrates an example process 200 for forming an III-V MOSFET including a source area or a drain area with one or more seed components, in accordance with some embodiments. FIGS. 3(a)-3(e) schematically illustrate the example process 200 with more details for forming an III-V MOSFET 300 including a source area or a drain area with one or more seed components. In embodiments, the process 200 may be used to form the III-V transistor 110 or the III-V transistor 120 as shown in FIG. 1.

Figure 3A:
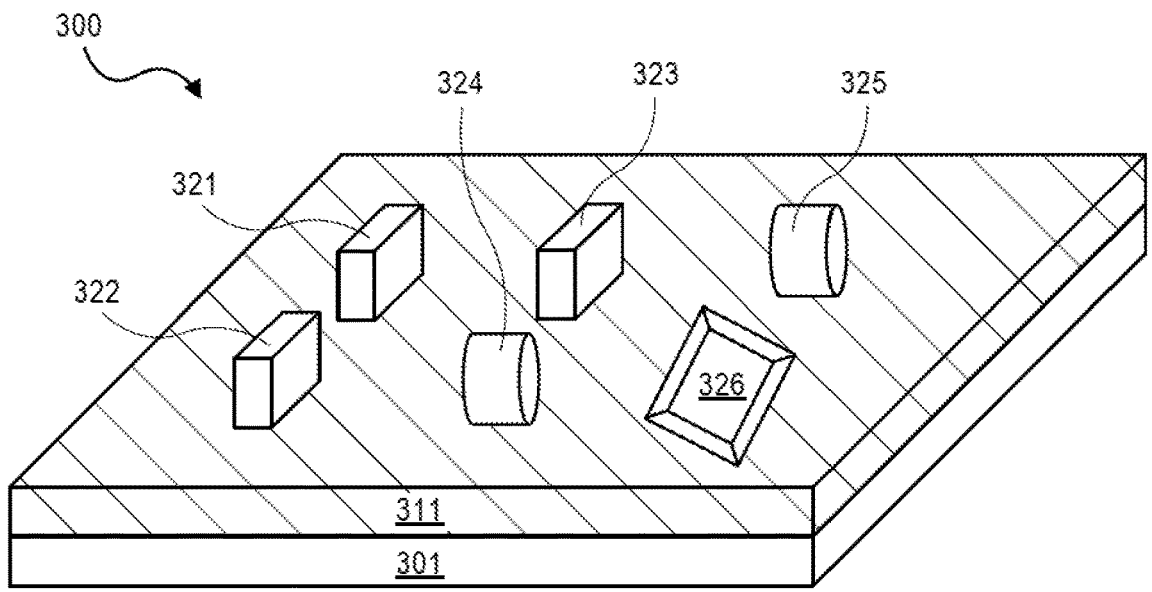
FIGS. 3(a)-3(e) schematically illustrate an example process with more details for forming an III-V MOSFET including a source area or a drain area with one or more seed components, in accordance with some embodiments.

At block 201, the process 200 may include forming an insulator layer above a substrate. For example, as shown in FIG. 3(a), the process 200 may include forming an insulator layer 311 above a substrate 301.

At block 203, the process 200 may include forming one or more seed components including a seed material with free surface above the insulator layer. For example, as shown in FIG. 3(a), the process 200 may include forming one or more seed components, e.g., a seed component 321, a seed component 322, a seed component 323, a seed component 324, a seed component 325, and a seed component 326, including a seed material with free surface above the insulator layer 311. A seed component, e.g., the seed component 321, the seed component 322, the seed component 323, the seed component 324, the seed component 325, or the seed component 326, may be of a rectangular shape, a triangular shape, a circular shape, or a cone shape. A seed component, e.g., the seed component 321, the seed component 322, the seed component 323, the seed component 324, the seed component 325, or the seed component 326, may have a small size, e.g., a size smaller and can be contained within a three dimensional space of 5-20 nm*5-20 nm*5-20 nm. A seed material included in a seed component, e.g., the seed component 321, the seed component 322, the seed component 323, the seed component 324, the seed component 325, or the seed component 326, may include GaAs, Ge, $In_xGa_{1-x}As$, where x is between 0 and 1, InSb, InAs, GaP, InGaP, or InP. In addition, a seed material may be lattice matched to the III-V material of a channel area formed above the seed components, or lattice matched to the substrate 301. Furthermore, a seed material includes a material with an etch selectivity different from the III-V material in the channel area above the seed components.

Figure 3B:
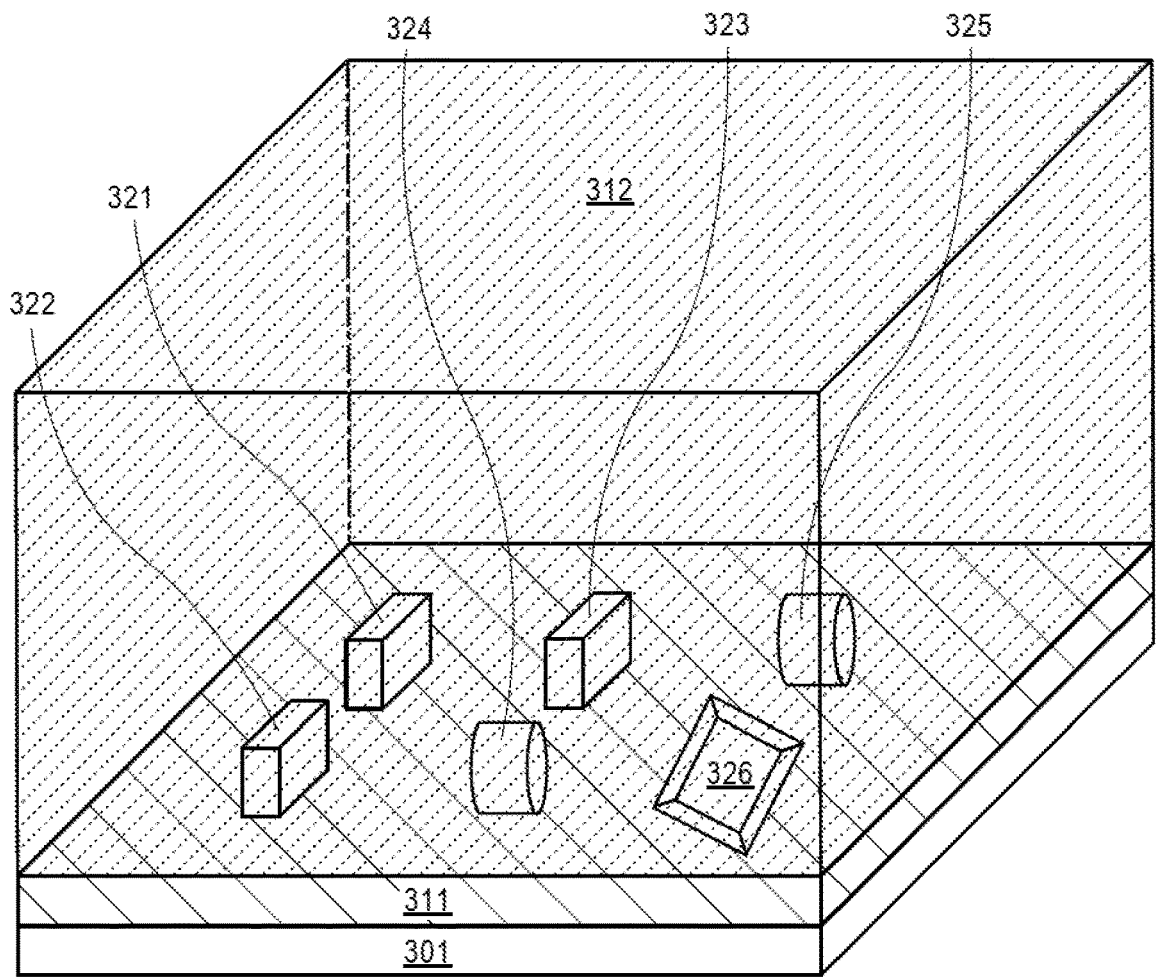

At block 205, the process 200 may include relaxed growing from the one or more seed components a channel layer above the one or more seed components, above the insulator layer, and in contact with the insulator layer, wherein the channel layer includes an III-V material. For example, as shown in FIG. 3(b), the process 200 may relaxed growing from the one or more seed components, e.g., the seed component 321, the seed component 322, the seed component 323, the seed component 324, the seed component 325, or the seed component 326, a channel layer 312 above the one or more seed components, above the insulator layer 311, and in contact with the insulator layer 311, wherein the channel layer 312 includes an material. The seed components, e.g., the seed component 321, the seed component 322, the seed component 323, the seed component 324, the seed component 325, or the seed component 326, may attract most or all defect areas at the interface area between the seed components and the channel layer 312. Hence, the channel layer 312 may be defect free in areas not in an interface with a seed component.

Figure 3C:
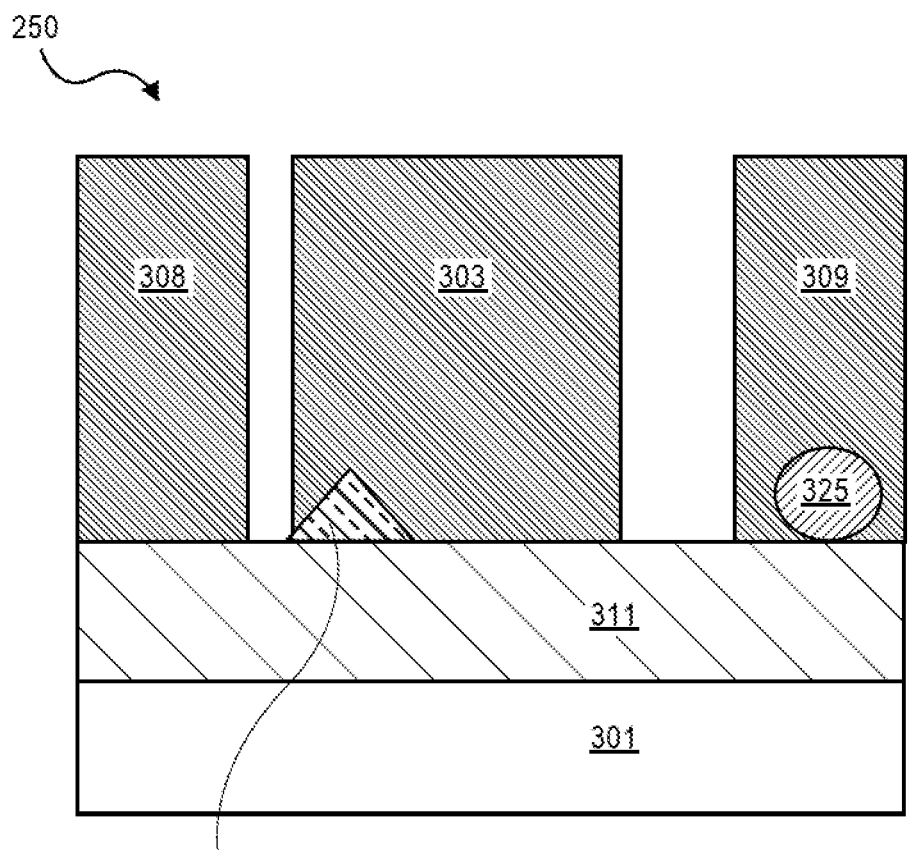

At block 207, the process 200 may include patterning the channel layer into one or more channel areas. For example, as shown in FIG. 3(c), the process 200 may include patterning the channel layer 312 into one or more channel areas, e.g., a fin 303, a fin 308, and a fin 309. The fin 303 may be formed above the seed component 326, the fin 309 may be formed above the seed component 325, while the fin 308 may be formed above the insulator layer 311 without a seed component. The fin 303, the fin 308, and the fin 309 may be channel areas of multiple MOSFETs. Some of the channel areas, e.g., the fin 308, may not have any seed component, and may be defect free.

Figure 3D:
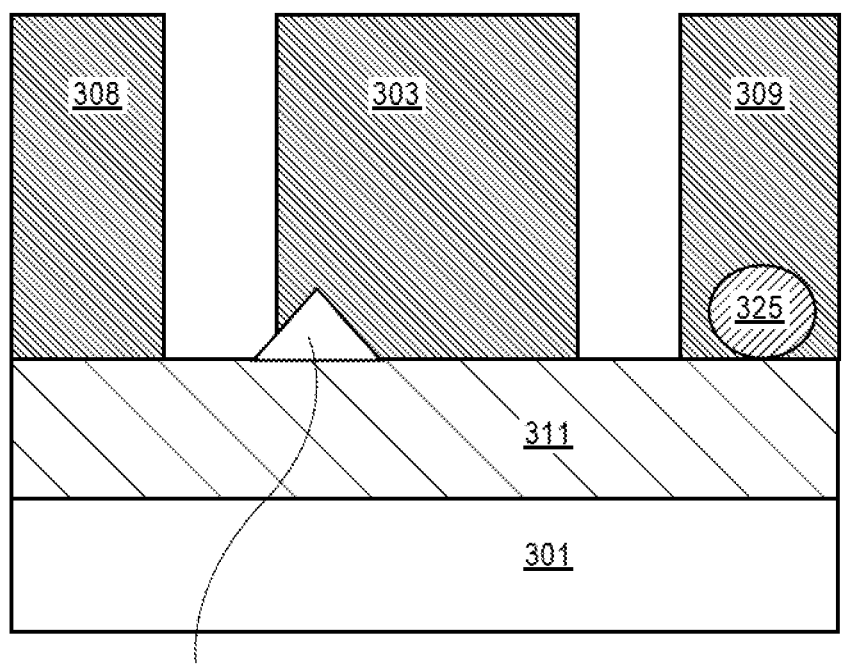

At block 209, the process 200 may include selectively removing a seed component from a channel area of the one or more channel areas. For example, as shown in FIG. 3(d), the process 200 may include selectively removing the seed component 326 from the channel area 303 to form a vacant space 371. In embodiments, the selectively removing the seed component 326 from the channel area 303 may include selectively etching to remove at least the seed component.

Figure 3E:
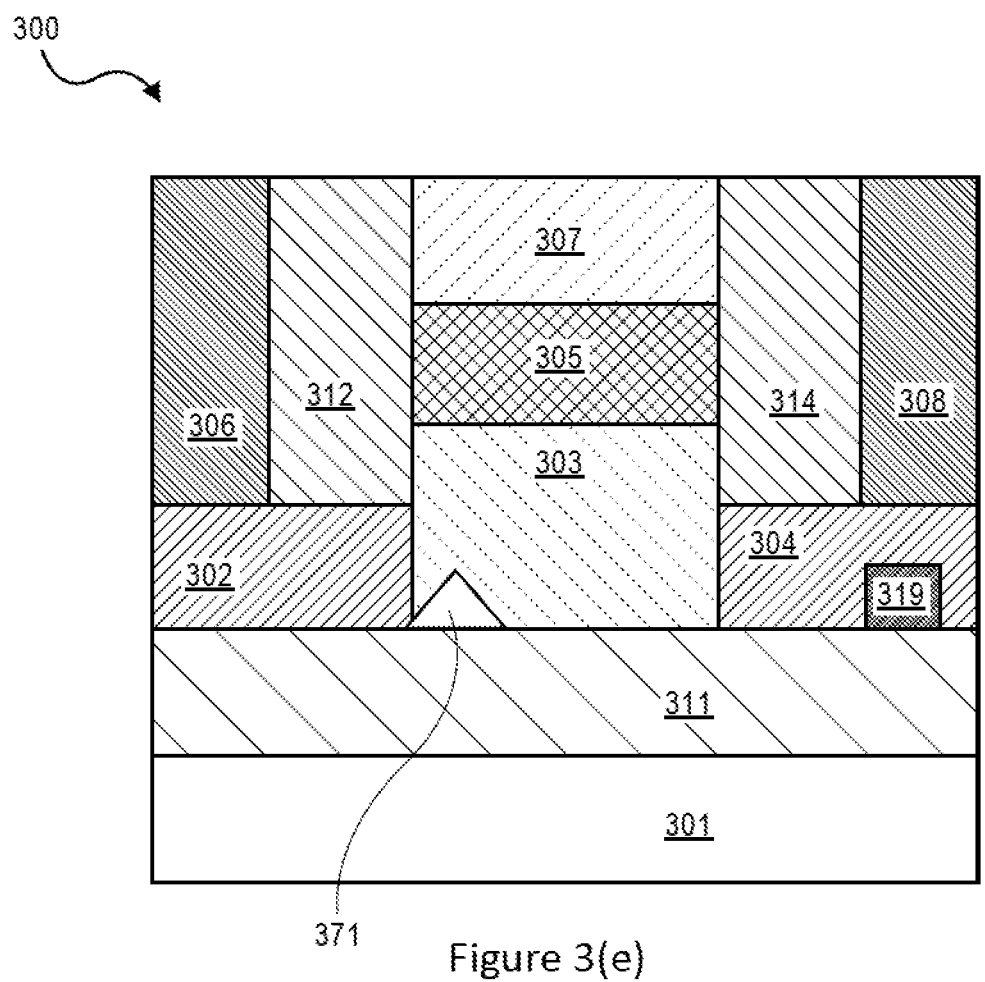

At block 211, the process 200 may include forming a source area above the insulator layer and adjacent to a first end of the channel area, and a drain area above the insulator layer and adjacent to a second end of the channel area that is opposite to the first end of the channel area, and forming a gate electrode separated from the channel area by a gate dielectric layer. The source area or the drain area includes at least a seed component of the one or more seed components. For example, as shown in FIG. 3(e), the process 200 may include forming a source area 302 above the insulator layer 311 and adjacent to a first end of the channel area 303, and a drain area 304 above the insulator layer 311 and adjacent to a second end of the channel area 303 that is opposite to the first end of the channel area. The drain area 304 may include a seed component 319. The process 200 may also include forming a gate electrode 307 separated from the channel area 303 by a gate dielectric layer 305. The vacant space 371 formed at block 209 shown in FIG. 3(d) may still be vacant. Alternatively, the vacant space 371 may be filled by gate oxide and gate metal when the gate electrode 307 is formed last.

In addition, the process 200 may include forming a source electrode 306 in contact with the source area 302, and forming a drain electrode 308 in contact with the drain area 304, a spacer 312 between the source electrode 306 and the gate electrode 307, and a spacer 314 between the drain electrode 308 and the gate electrode 307.

Figure 4:
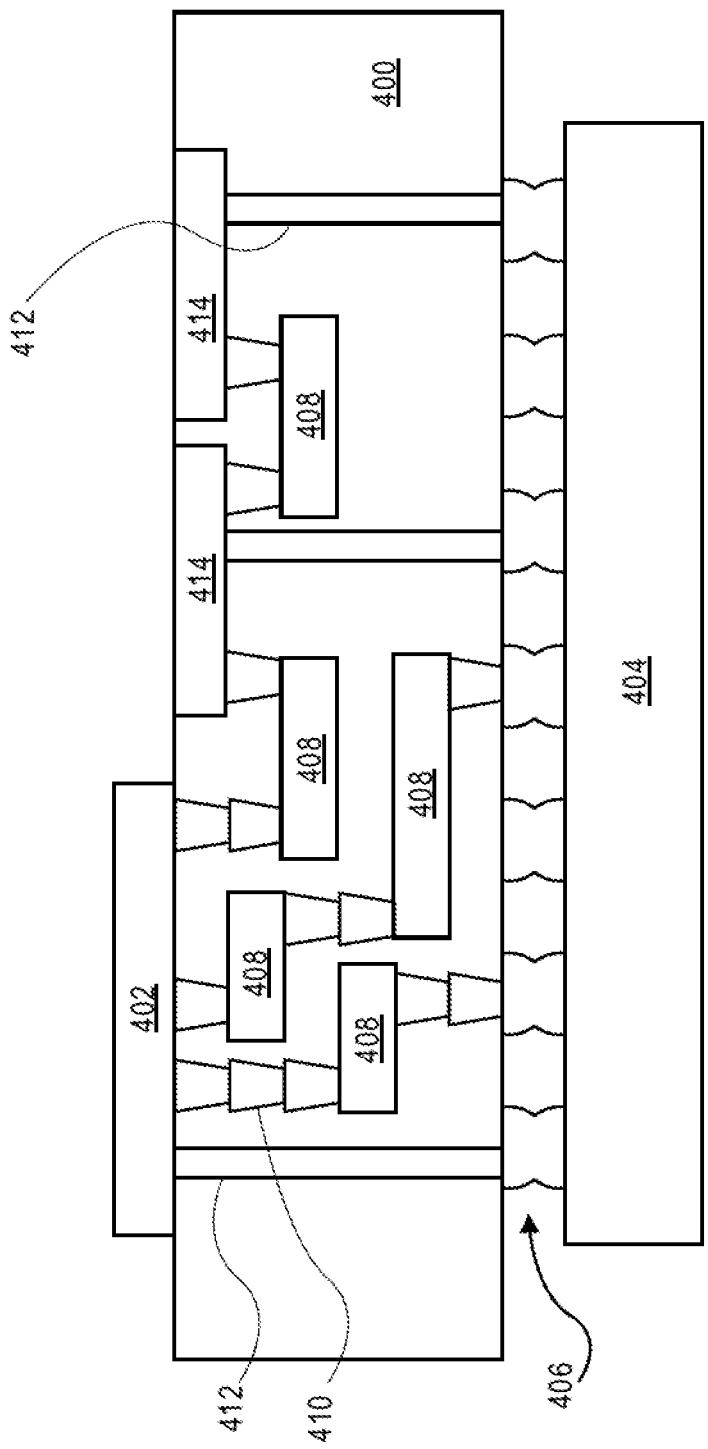
FIG. 4 schematically illustrates an interposer implementing one or more embodiments of the disclosure, in accordance with some embodiments.

FIG. 4 illustrates an interposer 400 that includes one or more embodiments of the disclosure. The interposer 400 is an intervening substrate used to bridge a first substrate 402 to a second substrate 404. The first substrate 402 may be, for instance, a substrate support the III-V transistor 110 and the III-V transistor 120 shown in FIG. 1, the III-V MOSFET 300 shown in FIG. 3(e), an III-V MOSFET formed by the process 200 shown in FIG. 2. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
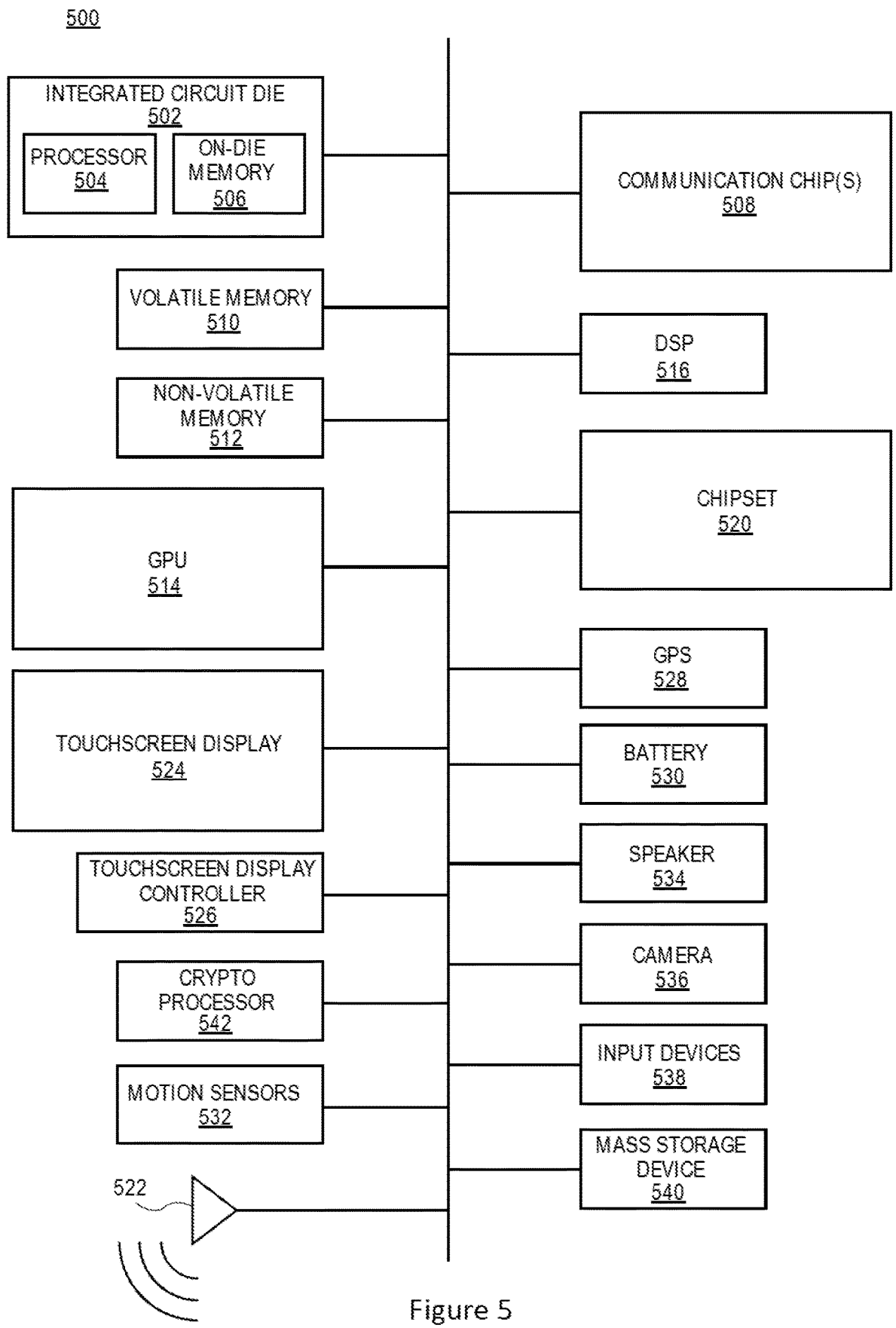
FIG. 5 schematically illustrates a computing device built in accordance with an embodiment of the disclosure, in accordance with some embodiments.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. For example, the processor 504 or the on-die memory 506, or other control circuits in the integrated circuit die 502 may include the III-V transistor 110 and the III-V transistor 120 shown in FIG. 1, the III-V MOSFET 300 shown in FIG. 3(e), an III-V MOSFET formed by the process 200 shown in FIG. 2.

In embodiments, the computing device 500 may include a display or a touchscreen display 524, and a touchscreen display controller 526. A display or the touchscreen display 524 may include a FPD, an AMOLED display, a TFT LCD, a micro light-emitting diode (μLED) display, or others.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power electronic device 531, a voltage regulator (not shown), a global positioning system (GPS) device 528, a compass, a motion coprocessor or sensors 532 (that may include an accelerometer, a gyroscope, and a compass), a microphone (not shown), a speaker 534, a resonator 535, a camera 536, user input devices 538 (such as a keyboard, mouse, stylus, and touchpad), and a mass storage device 540 (such as hard disk drive, compact disk (CD), digital versatile disk (DVD), and so forth). In embodiments, various components may include the III-V transistor 110 and the III-V transistor 120 shown in FIG. 1, the III-V MOSFET 300 shown in FIG. 3(e), an III-V MOSFET formed by the process 200 shown in FIG. 2.

The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In further embodiments, another component housed within the computing device 500 may contain one or more devices, such as the power electronic device 531, that are formed in accordance with implementations of the current disclosure, e.g., the III-V transistor 110 and the III-V transistor 120 shown in FIG. 1, the III-V MOSFET 300 shown in FIG. 3(e), an III-V MOSFET formed by the process 200 shown in FIG. 2.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 may include a semiconductor device, comprising: a substrate; an insulator layer above the substrate; a channel area including an III-V material relaxed grown on the insulator layer; a source area above the insulator layer, in contact with the insulator layer, and adjacent to a first end of the channel area; and a drain area above the insulator layer, in contact with the insulator layer, and adjacent to a second end of the channel area that is opposite to the first end of the channel area, wherein the source area or the drain area includes one or more seed components including a seed material with free surface.

Example 2 may include the semiconductor device of example 1 and/or some other examples herein, wherein the channel area includes one or more seed components including the seed material with free surface.

Example 3 may include the semiconductor device of example 2 and/or some other examples herein, further comprising: a gate electrode separated from the channel area by a gate dielectric layer.

Example 4 may include the semiconductor device of example 2 and/or some other examples herein, wherein a seed component of the one or more seed components in the channel area or a seed component of the one or more seed components in the source area or the drain area is of a shape selected from the group consisting of a rectangular shape, a triangular shape, a circular shape, and a cone shape.

Example 5 may include the semiconductor device of example 2 and/or some other examples herein, wherein a seed component of the one or more seed components in the channel area or a seed component of the one or more seed components in the source area or the drain area is contained within a three dimensional space of (2-15) nm*(2-15) nm* (2-15) nm.

Example 6 may include the semiconductor device of example 2 and/or some other examples herein, wherein the seed material includes a material selected from the group consisting of GaAs, Ge, $In_xGa_{1-x}As$, where x is between 0 and 1, InSb, InAs, GaP, InGaP, and InP.

Example 7 may include the semiconductor device of example 2 and/or some other examples herein, wherein the seed material is lattice matched to the III-V material of the channel area, or lattice matched to the substrate.

Example 8 may include the semiconductor device of example 2 and/or some other examples herein, wherein the seed material includes a material with an etch selectivity different from the III-V material in the channel area.

Example 9 may include the semiconductor device of example 1 and/or some other examples herein, wherein the insulator layer includes a material selected from the group consisting of $SiO_2$, SiN, SiON, $Al_2O_3$, $AlSiO_x$, $HfSiO_x$, $HfO_2$, and $ZrO_2$.

Example 10 may include the semiconductor device of example 1 and/or some other examples herein, wherein the III-V compound in the channel area includes a material selected from the group consisting of indium (In), phosphorus (P), gallium (Ga), or arsenic (As), SiGe, Al, GaAs, $In_xGa_{1-x}As$, $In_xGa_{1-x}P$, $GaAs_xSb_{1-x}$, where x is between 0 and 1, InSb, InAs, GaP, InGaP, and InP.

Example 11 may include the semiconductor device of example 1 and/or some other examples herein, wherein the substrate is a silicon substrate with a (111), (100), or (110) crystal plane as a principal plane.

Example 12 may include the semiconductor device of example 1 and/or some other examples herein, wherein the channel area includes a channel area selected from the group consisting of a FinFET channel, a nanowire channel, a nanotube channel, a nanoribbon channel, and a bulk transistor channel.

Example 13 may include the semiconductor device of example 1 and/or some other examples herein, wherein the source area includes n-type dopant or p-type dopant.

Example 14 may include a method for forming a semiconductor device, the method comprising: forming an insulator layer above a substrate; forming one or more seed components including a seed material with free surface above the insulator layer; relaxed growing from the one or more seed components a channel layer above the one or more seed components, above the insulator layer, and in contact with the insulator layer, wherein the channel layer includes an III-V material; and patterning the channel layer into one or more channel areas.

Example 15 may include the method of example 14 and/or some other examples herein, wherein a channel area of the one or more channel areas includes at least a seed component of the one or more seed components, and the method further comprises: selectively removing at least the seed component from the channel area.

Example 16 may include the method of example 15 and/or some other examples herein, wherein the selectively removing at least the seed component from the channel area includes selectively etching to remove at least the seed component.

Example 17 may include the method of example 14 and/or some other examples herein, further comprising: forming a source area above the insulator layer and adjacent to a first end of the channel area, and a drain area above the insulator layer and adjacent to a second end of the channel area that is opposite to the first end of the channel area, wherein the source area or the drain area includes at least a seed component of the one or more seed components; and forming a gate electrode separated from the channel area by a gate dielectric layer.

Example 18 may include the method of example 14 and/or some other examples herein, wherein a seed component of the one or more seed components above the insulator layer is of a shape selected from the group consisting of a rectangular shape, a triangular shape, a circular shape, and a cone shape.

Example 19 may include the method of example 14 and/or some other examples herein, wherein the seed material includes a material selected from the group consisting of GaAs, Ge, $In_xGa_{1-x}As$, where x is between 0 and 1, InSb, InAs, GaP, InGaP, and InP.

Example 20 may include the method of example 14 and/or some other examples herein, wherein the insulator layer includes a material selected from the group consisting of $SiO_2$, SiN, SiON, $Al_2O_3$, $AlSiO_x$, $HfSiO_x$, $HfO_2$, and $ZrO_2$.

Example 21 may include the method of example 14 and/or some other examples herein, wherein the III-V compound in the channel area includes a material selected from the group consisting of indium (In), phosphorus (P), gallium (Ga), or arsenic (As), SiGe, Al, GaAs, $In_xGa_{1-x}As$, $In_xGa_{1-x}P$, $GaAs_xSb_{1-x}$, where x is between 0 and 1, InSb, InAs, GaP, InGaP, and InP.

Example 22 may include a computing device, comprising: a processor; and a memory device coupled to the processor, wherein the memory device or the processor includes a transistor comprising: a substrate; an insulator layer above the substrate; a channel area including an III-V material relaxed grown on the insulator layer; a source area above the insulator layer, in contact with the insulator layer, and adjacent to a first end of the channel area; and a drain area above the insulator layer, in contact with the insulator layer, and adjacent to a second end of the channel area that is opposite to the first end of the channel area, wherein the source area or the drain area includes one or more seed components including a seed material with free surface.

Example 23 may include the computing device of example 22 and/or some other examples herein, wherein a seed component of the one or more seed components in the source area or the drain area is of a shape selected from the group consisting of a rectangular shape, a triangular shape, a circular shape, and a cone shape.

Example 24 may include the computing device of example 22 and/or some other examples herein, wherein the seed material includes a material selected from the group consisting of GaAs, Ge, $In_xGa_{1-x}As$, where x is between 0 and 1, InSb, InAs, GaP, InGaP, and InP; the seed material is lattice matched to the III-V material of the channel area, or lattice matched to the substrate; and the seed material includes a material with an etch selectivity different from the III-V material in the channel area.

Example 25 may include the computing device of example 22 and/or some other examples herein, wherein the computing device includes a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   an insulator layer above the substrate;
   a channel area including an III-V material relaxed grown on the insulator layer;
   a source area above the insulator layer, in contact with the insulator layer, and adjacent to a first end of the channel area; and
   a drain area above the insulator layer, in contact with the insulator layer, and adjacent to a second end of the channel area that is opposite to the first end of the channel area, wherein the source area or the drain area includes a plurality of discrete seed components each including a seed material with free surface, wherein the discrete seed components are not epitaxially merged, and the source area or the drain area having an epitaxial material layer in direct contact with the plurality of discrete seed components, wherein the plurality of discrete seed components have a composition different from a composition of the epitaxial material layer of the source area or the drain area.

2. The semiconductor device of claim 1, wherein the channel area includes one or more seed components including the seed material with free surface.

3. The semiconductor device of claim 2, further comprising:
   a gate electrode separated from the channel area by a gate dielectric layer.

4. The semiconductor device of claim 2, wherein a seed component of the plurality of discrete seed components in the channel area or a seed component of the plurality of discrete seed components in the source area or the drain area is of a shape selected from the group consisting of a rectangular shape, a triangular shape, a circular shape, and a cone shape.

5. The semiconductor device of claim 2, wherein a seed component of the plurality of discrete seed components in the channel area or a seed component of the plurality of discrete seed components in the source area or the drain area is contained within a three dimensional space of (2-15) nm*(2-15) nm*(2-15) nm.

6. The semiconductor device of claim 2, wherein the seed material includes a material selected from the group consisting of GaAs, Ge, $In_xGa_{1-x}As$, where x is between 0 and 1, InSb, InAs, GaP, InGaP, and InP.

7. The semiconductor device of claim 2, wherein the seed material is lattice matched to the III-V material of the channel area, or lattice matched to the substrate.

8. The semiconductor device of claim 2, wherein the seed material includes a material with an etch selectivity different from the III-V material in the channel area.

9. The semiconductor device of claim 1, wherein the insulator layer includes a material selected from the group consisting of $SiO_2$, SiN, SiON, $Al_2O_3$, $AlSiO_x$, $HfSiO_x$, $HfO_2$, and $ZrO_2$.

10. The semiconductor device of claim 1, wherein the III-V compound in the channel area includes a material selected from the group consisting of indium (In), phosphorus (P), gallium (Ga), or arsenic (As), SiGe, Al, GaAs, $In_xGa_{1-x}As$, $In_xGa_{1-x}P$, $GaAs_xSb_{1-x}$, where x is between 0 and 1, InSb, InAs, GaP, InGaP, and InP.

11. The semiconductor device of claim 1, wherein the substrate is a silicon substrate with a (111), (100), or (110) crystal plane as a principal plane.

12. The semiconductor device of claim 1, wherein the channel area includes a channel area selected from the group consisting of a FinFET channel, a nanowire channel, a nanotube channel, a nanoribbon channel, and a bulk transistor channel.

13. The semiconductor device of claim 1, wherein the source area includes n-type dopant or p-type dopant.

14. A computing device, comprising:
    a processor; and
    a memory device coupled to the processor, wherein the memory device or the processor includes a transistor comprising:
    a substrate;
    an insulator layer above the substrate;
    a channel area including an III-V material relaxed grown on the insulator layer;
    a source area above the insulator layer, in contact with the insulator layer, and adjacent to a first end of the channel area; and
    a drain area above the insulator layer, in contact with the insulator layer, and adjacent to a second end of the channel area that is opposite to the first end of the channel area, wherein the source area or the drain area includes a plurality of discrete seed components each including a seed material with free surface, wherein the discrete seed components are not epitaxially merged, and the source area or the drain area having an epitaxial material layer in direct contact with the plurality of discrete seed components, wherein the plurality of discrete seed components have a composition different from a composition of the epitaxial material layer of the source area or the drain area.

15. The computing device of claim 14, wherein a seed component of the plurality of discrete seed components in the source area or the drain area is of a shape selected from the group consisting of a rectangular shape, a triangular shape, a circular shape, and a cone shape.

16. The computing device of claim 14, wherein the seed material includes a material selected from the group consisting of GaAs, Ge, $In_xGa_{1-x}As$, where x is between 0 and 1, InSb, InAs, GaP, InGaP, and InP; the seed material is lattice matched to the III-V material of the channel area, or lattice matched to the substrate; and the seed material includes a material with an etch selectivity different from the III-V material in the channel area.

17. The computing device of claim 14, wherein the computing device includes a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

* * * * *